United States Patent
Jang

[11] Patent Number: 6,165,915
[45] Date of Patent: Dec. 26, 2000

[54] FORMING HALOGEN DOPED GLASS DIELECTRIC LAYER WITH ENHANCED STABILITY

[75] Inventor: Syun-Ming Jang, Hsin-Chu, Taiwan

[73] Assignee: Taiwan Semiconductor Manufacturing Company, Hsin-Chu, Taiwan

[21] Appl. No.: 09/372,078

[22] Filed: Aug. 11, 1999

[51] Int. Cl.[7] .................................................. H01L 21/469
[52] U.S. Cl. ......................... 438/787; 438/787; 438/778; 438/758; 438/723; 257/632; 257/634; 257/641; 257/645; 257/649
[58] Field of Search .................... 438/787, 778, 438/758, 723

[56] References Cited

U.S. PATENT DOCUMENTS

| | | | |
|---|---|---|---|
| 5,661,093 | 8/1997 | Ravi et al. | 438/763 |
| 5,759,906 | 6/1998 | Lou | 438/623 |
| 5,763,010 | 6/1998 | Guo et al. | 427/376.2 |
| 5,858,869 | 1/1999 | Chen et al. | 438/597 |
| 5,861,345 | 1/1999 | Chou et al. | 438/763 |
| 5,908,672 | 6/1999 | Ryu et al. | 427/574 |
| 5,937,323 | 8/1999 | Orczyk et al. | 438/624 |
| 6,070,551 | 6/2000 | Li et al. | 118/723 |
| 6,079,354 | 6/2000 | Guo et al. | 118/719 |
| 6,103,601 | 8/2000 | Lee et al. | 438/513 |

OTHER PUBLICATIONS

S. Wolf and R.N. Tauber, Silicon Processing for the VLSI Era, vol. 2 Lattice Press, Calif, pp. 199–203, 1986.

*Primary Examiner*—Matthew Smith
*Assistant Examiner*—Granvill D. Lee
*Attorney, Agent, or Firm*—George O. Saile; Stephen B. Ackerman; Stephen G. Stanton

[57] ABSTRACT

Within a method for forming a halogen doped glass layer, such as a fluorosilicate glass (FSG) layer, there is first provided a substrate. There is then formed over the substrate a first halogen doped glass layer. There is then formed upon the first halogen doped glass layer a barrier layer. There is then formed upon the barrier layer a second halogen doped glass layer. Finally, there is then planarized the second halogen doped glass layer, while not penetrating the barrier layer, to form a planarized halogen doped glass layer.

24 Claims, 2 Drawing Sheets

006,165,915

FORMING HALOGEN DOPED GLASS DIELECTRIC LAYER WITH ENHANCED STABILITY

BACKGROUND OF THE INVENTION

1. Field of the Invention

The present invention relates generally to methods for forming dielectric layers within microelectronic fabrications. More particularly, the present invention relates to methods for forming, with enhanced stability, halogen doped glass dielectric layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly important within the art of microelectronic fabrication to form interposed between the patterns of patterned microelectronic conductor layers within microelectronic fabrications microelectronic dielectric layers formed of comparatively low dielectric constant dielectric materials. Dielectric layers formed of comparatively low dielectric constant dielectric materials are desirable formed interposed between the patterns of patterned microelectronic conductor layers within microelectronic fabrications since such dielectric layers assist in providing microelectronic fabrications possessing enhanced microelectronic fabrication speed and attenuated patterned microelectronic conductor layer cross-talk.

Of the comparatively low dielectric constant dielectric materials potentially applicable for forming dielectric layers interposed between the patterns of patterned microelectronic conductor layers within microelectronic fabrications, halogen doped glass dielectric materials, and in particular fluorosilicate glass (FSG) dielectric materials, are presently of considerable interest. Halogen doped glass dielectric materials are presently of considerably interest for forming dielectric layers of comparatively low dielectric constant formed interposed between the patterns of patterned microelectronic conductor layers within microelectronic fabrications since in addition to possessing a comparatively low dielectric constant, halogen doped glass dielectric materials, and in particular fluorosilicate glass (FSG) dielectric materials, may typically be readily formed employing deposition methods, such as but not limited to chemical vapor deposition (CVD) methods, as are otherwise conventional in the art of microelectronic fabrication.

For comparison purposes, while fluorosilicate glass (FSG) dielectric materials may be employed for forming dielectric layers within microelectronic fabrications, where the dielectric layers have a bulk dielectric constant of from about 3.5 to about 3.8, conventional silicon containing dielectric materials as employed within microelectronic fabrication, such as but not limited to silicon oxide dielectric materials, silicon nitride dielectric materials and silicon oxynitride dielectric materials as employed within microelectronic fabrications, typically provide within microelectronic fabrications dielectric layers having a bulk dielectric constant of from about 4.0 to about 6.0.

While fluorosilicate glass (FSG) dielectric materials are thus particularly desirable in the art of microelectronic fabrication for forming low dielectric constant dielectric layers interposed between the patterns of patterned microelectronic conductor layers within microelectronic fabrications, fluorosilicate glass (FSG) dielectric materials in particular, and halogen doped glass dielectric materials more generally, are nonetheless not entirely without problems in the art of microelectronic fabrication for forming low dielectric constant dielectric layers formed interposed between the patterns of patterned microelectronic conductor layers within microelectronic fabrications. In that regard, it is known in the art of microelectronic fabrication that halogen doped glass dielectric materials, such as fluorosilicate glass (FSG) dielectric materials, when employed for forming dielectric layers within microelectronic fabrications suffer from instability which leads to problems such as but not limited to: (1) outgassing of mobile halogen (i.e. fluorine) species from halogen doped glass dielectric materials such as a fluorosilicate glass (FSG) dielectric materials, which outgassing might lead to increases in dielectric constant of the halogen doped glass dielectric materials; and (2) moisture sorbtion into ambiently exposed halogen doped glass dielectric materials which might lead to formation of acidic (i.e. hydrofluoric acid) reaction products within the halogen doped glass dielectric materials.

It is thus towards the goal of forming within microelectronic fabrications low dielectric constant dielectric layers formed employing halogen doped glass dielectric materials, and more particularly fluorosilicate glass (FSG) dielectric materials, while forming the low dielectric constant dielectric layers with enhanced stability, that the present invention is directed.

Various methods have been disclosed in the art of microelectronic fabrication for forming dielectric layers with desirable properties within microelectronic fabrications.

For example, Ravi et al., in U.S. Pat. No. 5,661,093, discloses a method for forming within a microelectronic fabrication a halogen doped glass dielectric layer, such as a fluorosilicate glass (FSG) dielectric layer, with enhanced resistance to moisture absorption into the halogen doped glass dielectric layer and enhanced resistance to halogen dopant outgassing from the halogen doped glass dielectric layer. The method employs when forming the halogen doped glass dielectric layer a multiplicity of sub-layers of the halogen doped glass dielectric layer, wherein each sub-layer of the halogen doped glass dielectric is separated from an adjoining sub-layer within of the halogen doped glass dielectric layer by a sealing layer within the halogen doped glass dielectric layer.

In addition, Lou, in U.S. Pat. No. 5,759,906, discloses a method for forming within a microelectronic fabrication a sandwich composite planarizing dielectric layer construction which incorporates a spin-on-glass (SOG) planarizing dielectric layer within the sandwich composite planarizing dielectric layer construction, where when forming a via through the sandwich composite planarizing dielectric layer construction there is attenuated within the via outgassing from the spin-on-glass (SOG) planarizing dielectric layer. The method realizes the foregoing result by: (1) employing when forming the spin-on-glass (SOG) planarizing dielectric layer within the sandwich composite planarizing dielectric layer construction a multi-layer spin-on-glass (SOG) planarizing dielectric layer, where each sub-layer within the multi-layer spin-on-glass (SOG) planarizing dielectric layer is cured at an elevated temperature for an elongated time period; and (2) employing after forming the via through the sandwich composite planarizing dielectric layer construction a dielectric sidewall spacer layer formed into the via to passivate portions of the spin-on-glass planarizing dielectric layer exposed within the via.

Further, Guo et al., in U.S. Pat. No. 5,763,010, discloses yet another method for forming, with enhanced stability with respect to halogen dopant outgassing, a halogen doped glass dielectric layer, such as a fluorosilicate glass (FSG) dielectric layer, within a microelectronic fabrication. The method employs a thermal annealing of the halogen doped glass dielectric layer at a temperature of about 300 to about 550 degrees centigrade, presumably to remove loosely bound halogen atoms which would otherwise outgas from within the halogen doped glass dielectric layer.

Yet further, Chen et al., in U.S. Pat. No. 5,858,869, discloses a method for forming, with enhanced process latitude and with enhanced dielectric properties, a sandwich composite planarizing dielectric layer construction formed upon a topographic substrate layer within a microelectronic fabrication. The method employs when forming the sandwich composite planarizing dielectric layer construction an anisotropically deposited silicon oxide layer formed upon the topographic substrate layer and employed as a liner layer within the sandwich composite planarizing dielectric layer construction, where the anisotropically deposited silicon oxide layer has a greater thickness upon upper lying horizontal features within the topographic substrate layer than upon vertical sidewall features within the topographic substrate layer.

Finally, Chou et al., in U.S. Pat. No. 5,861,345, discloses a method for forming within a microelectronic fabrication a sandwich composite planarizing dielectric layer construction with: (1) a reduced susceptibility to delamination of dielectric layers within the sandwich composite planarizing dielectric layer construction; and (2) a reduced susceptibility of cracking within a spin-on-glass (SOG) planarizing dielectric layer employed within the sandwich composite planarizing dielectric layer construction. The method employs when forming the sandwich composite planarizing dielectric layer construction either of a nitrous oxide plasma treatment or hexafluoroethane plasma treatment of the spin-on-glass (SOG) planarizing dielectric layer within the sandwich composite planarizing dielectric layer construction prior to forming in-situ upon the plasma treated spin-on-glass (SOG) planarizing dielectric layer so formed a capping dielectric layer formed employing a plasma enhanced chemical vapor deposition (PECVD) method.

Desirable in the art of microelectronic fabrication are additional methods and materials which may be employed for forming within microelectronic fabrications halogen doped glass dielectric layers, such as but not limited to fluorosilicate glass (FSG) dielectric layers, with enhanced stability.

It is towards the foregoing object that the present invention is directed.

SUMMARY OF THE INVENTION

A first object of the present invention is to provide a method for forming within a microelectronic fabrication a halogen doped glass dielectric layer, such as but not limited to a fluorosilicate glass (FSG) dielectric layer.

A second object of the present invention is to provide a method in accord with the first object of the present invention, where the halogen doped glass dielectric layer is formed with enhanced stability.

A third object of the present invention is to provide a method in accord with the first object of the present invention and the second object of the present invention, which method is readily commercially implemented.

In accord with the objects of the present invention, there is provided by the present invention a method for forming a halogen doped glass layer, such as but not limited to a fluorosilicate glass (FSG) layer. To practice the method of the present invention, there is first provided a substrate. There is then formed over the substrate a first halogen doped glass layer. There is then formed upon the first halogen doped glass layer a barrier layer. There is then formed upon the barrier layer a second halogen doped glass layer. Finally, there is then planarized the second halogen doped glass layer while not penetrating the barrier layer.

The present invention provides a method for forming within a microelectronic fabrication a halogen doped glass dielectric layer, such as but not limited to a fluorosilicate glass (FSG) dielectric layer, where the halogen doped glass dielectric layer is formed with enhanced stability. The method of the present realizes the foregoing object by employing when forming a halogen doped glass layer a bilayer halogen doped glass layer having a barrier layer formed interposed between a first (lower) halogen doped glass layer and a second (upper) halogen doped glass layer within the bilayer halogen doped glass layer, where when planarizing the second (upper) halogen doped glass layer within the bilayer halogen doped glass layer the barrier layer is not penetrated.

The method of the present invention is readily commercially implemented. The present invention employs methods and materials as are otherwise generally known in the art of microelectronic fabrication. Since it is a process control within the present invention which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronic fabrication a halogen doped glass layer, such as but not limited to a fluorosilicate glass (FSG) layer, where the halogen doped glass layer is formed with enhanced stability. The method of the present realizes the foregoing object by employing when forming a halogen doped glass layer a bilayer halogen doped glass layer having a barrier layer formed interposed between a first (lower) halogen doped glass layer and a second (upper) halogen doped glass layer within the bilayer halogen doped glass layer, where when planarizing the second (upper) halogen doped glass layer within the bilayer halogen doped glass layer the barrier layer is not penetrated.

The present invention may be employed for forming with enhanced stability halogen doped glass layers, such as but not limited to fluorosilicate glass (FSG) layers, within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
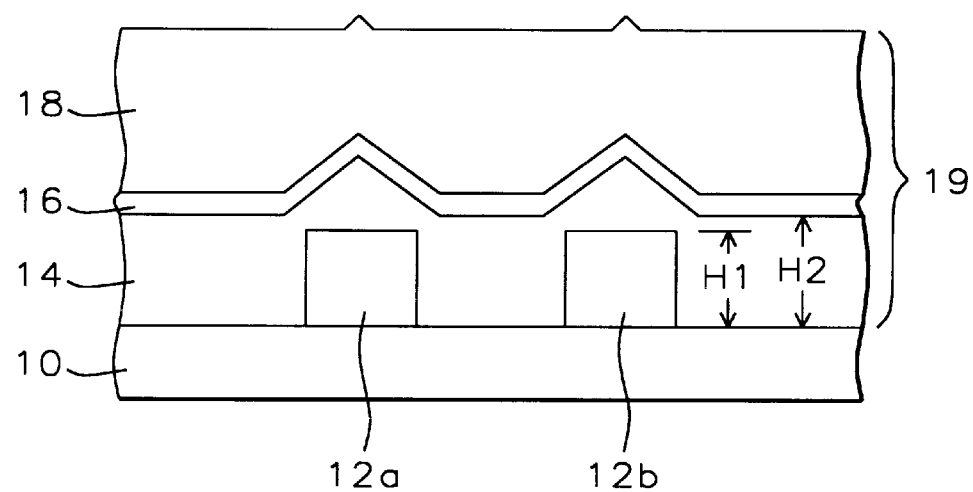
FIG. 1, FIG. 2 and FIG. 3 show a series of schematic cross-sectional diagrams illustrating the results of forming, in accord with a preferred embodiment of the present invention, a fluorosilicate glass (FSG) dielectric layer within a microelectronic fabrication.
Figure 2:
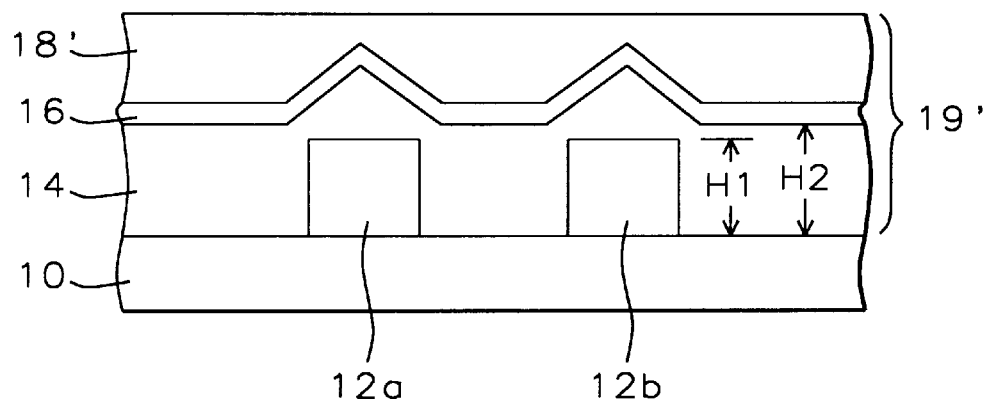
Figure 3:
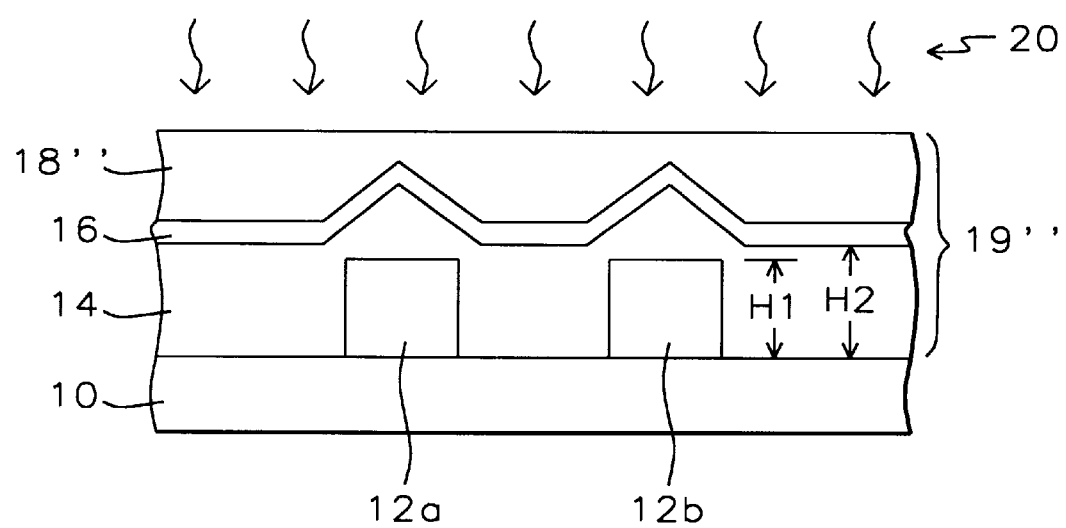

Referring now to FIG. 1 to FIG. 3, there is show a series of schematic cross-sectional diagrams illustrating the results of forming, in accord with a preferred embodiment of the present invention, a fluorosilicate glass (FSG) layer within a microelectronic fabrication. Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed thereupon a pair of patterned layers 12a and 12b which typically and preferably serve as a pair of contact layers.

Within the preferred embodiment of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic fabrications and display image array optoelectronic microelectronic fabrications.

Although not specifically illustrated within the schematic cross-sectional diagram of FIG. 1, the substrate 10 may comprise a substrate alone as employed within the microelectronic fabrication, or in the alternative, the substrate 10 may comprise the substrate as employed within the microelectronic fabrication, where the substrate has formed thereupon and/or thereover any of several additional layers as are conventional within the microelectronic fabrication within which is employed the substrate. Similarly with the substrate itself, such additional microelectronic layers may be formed from microelectronic materials selected from the group including but not limited to microelectronic conductor materials, microelectronic semiconductor materials and microelectronic dielectric materials.

Similarly, although also not specifically illustrated within the schematic cross-sectional diagram of FIG. 1, the substrate 10, typically but not exclusively when the substrate 10 comprises a semiconductor substrate employed within a semiconductor integrated circuit microelectronic fabrication, has formed therein and/or thereupon any of several microelectronic devices as are common within the microelectronic fabrication within which is employed the substrate 10. Such microelectronic devices may include, but are not limited to, resistors, transistors, diodes and capacitors.

Within the preferred embodiment of the present invention with respect to the patterned layers 12a and 12b, although: (1) in general within the method of the present invention the patterned layers 12a and 12b may be formed from any of several microelectronic materials as are conventional in the art of microelectronic fabrication, including but not limited to microelectronic conductor materials, microelectronic semiconductor materials and microelectronic dielectric materials; and (2) within a broad context of the present invention the pair of patterned layers 12a and 12b is optional, for the preferred embodiment of the present invention value of the present invention is provided when the pair of patterned layers 12a and 12b is formed of a microelectronic conductor material or a microelectronic semiconductor material, more preferably a microelectronic conductor material, so that there may be observed and realized enhanced electrical properties within the microelectronic fabrication within which is formed the pair of patterned layers 12a and 12b. Typically and preferably, each patterned layer 12a or 12b within the pair of patterned layers 12a and 12b is formed of a thickness H1 of from about 3000 to about 5000 angstroms, and a linewidth of from about 0.2 to about 0.4 microns, while being separated from an adjoining patterned layer by a pitch dimension of from about 0.2 to about 0.4 microns.

Also shown in FIG. 1 is a composite dielectric layer construction 19 comprising: (1) a first fluorosilicate glass (FSG) layer 14 formed upon the pair of patterned layers 12a and 12b and portions of the substrate 10 not covered by the pair of patterned layers 12a and 12b; (2) a barrier layer 16 formed upon the first fluorosilicate glass (FSG) layer 14; and (3) a second fluorosilicate glass (FSG) layer 18 formed upon the barrier layer 16. Within the preferred embodiment of the present invention, each of the first fluorosilicate glass (FSG) layer 14, the barrier layer 16 and the second fluorosilicate glass (FSG) layer 18 may be formed employing methods and materials as are conventional in the art of microelectronic fabrication.

For example, although it is known in the art of microelectronic fabrication that fluorosilicate glass (FSG) layers may be formed employing methods including but not limited to chemical vapor deposition (CVD) methods and physical vapor deposition (PVD) methods, for the preferred embodiment of the present invention, as is illustrated by the cross-sectional profile of both the first fluorosilicate glass (FSG) layer 14 and the second fluorosilicate glass (FSG) dielectric layer 18 as illustrated within the schematic cross-sectional diagram of FIG. 1, both the first fluorosilicate glass (FSG) layer 14 and the second fluorosilicate glass (FSG) layer 18 are formed employing a high density plasma chemical vapor deposition (HDP-CVD) method. As is understood by a person skilled in the art, high density plasma chemical vapor deposition (HDP-CVD) methods are alternatively described as simultaneous plasma enhanced chemical vapor deposition methods undertaken in conjunction with sputter etch methods, where a deposition rate within the plasma enhanced chemical vapor deposition (PECVD) method is greater than a sputter rate within the sputter etch method. Within the preferred embodiment of the present invention, both the first fluorosilicate glass (FSG) layer 14 and the second fluorosilicate glass (FSG) layer 18 are formed employing a high density plasma chemical vapor deposition (HDP-CVD) method which employs a reactant gas composition comprising: (1) silane as a silicon source material; (2) oxygen as an oxidant source material; (3) carbon tetrafluoride as a fluorine source material; and (4) argon as a sputter source material, although alternative source materials may be selected as silicon source materials, oxidant source materials, fluorine source materials and sputter source materials for forming fluorosilicate glass (FSG) layers within the context of the present invention.

When forming either the first fluorosilicate glass (FSG) layer 14 or the second fluorosilicate glass (FSG) layer 18 upon or over an eight inch diameter substrate 10, the high density plasma chemical vapor deposition (HDP-CVD) method also employs: (1) a reactor chamber pressure of from about 5 to about 10 mtorr; (2) a source radio frequency power of from about 2500 to about 3500 watts at a source radio frequency of 13.56 MHZ; (3) a bias power of from about 2500 to about 3500 watts; (4) a substrate 10 temperature of from about 380 to about 420 degrees centigrade; (5) a silane flow rate of from about 30 to about 40 standard cubic centimeters per minute (sccm); (6) an oxygen flow rate of from about 100 to about 120 standard cubic centimeters per minute (sccm); (7) a carbon tetrafluoride flow rate of from about 25 to about 35 standard cubic centimeters per minute (sccm); and (8) an argon flow rate of from about 30 to about 50 standard cubic centimeters per minute (sccm).

Within the preferred embodiment of the present invention with respect to the barrier layer 16, the barrier layer 16 is formed of a material which at minimum: (1) impedes diffusion of fluorine containing species from within the first fluorosilicate glass (FSG) layer 14; and (2) impedes diffusion of moisture into the first fluorosilicate glass (FSG) layer. Although the barrier layer 16 may be formed from any of several barrier materials as are known in the art of microelectronic fabrication to provide such diffusion barriers, including but not limited to dense silicon oxide dielectric barrier materials, dense silicon nitride dielectric barrier materials and dense silicon oxynitride dielectric barrier materials, for the preferred embodiment of the present invention the barrier layer 16 is typically and preferably formed of a dense undoped silicate glass (USG) barrier material preferably formed employing an otherwise generally conventional plasma enhanced chemical vapor deposition (PECVD) method, although a high density plasma chemical vapor deposition (HDP-CVD) method otherwise analogous or equivalent to the high density plasma chemical vapor deposition (HDP-CVD) method employed for forming the first fluorosilicate glass (FSG) layer 14 and the second fluorosilicate glass (FSG) layer 18 may also be employed, but with the absence of the fluorine source material. More preferably, the barrier layer 16 is formed of a silicon rich undoped silicate glass (USG) barrier material having a silicon:oxygen atomic ratio of from about 1.1:2 to about 1.3:2. Such silicon rich undoped silicate glass (USG) barrier materials exhibit particularly effective barrier properties within the context of the present invention.

When forming the barrier layer from such a silicon rich undoped silicate glass (USG) barrier material formed over an eight inch diameter substrate 10 while employing the conventional plasma enhanced chemical vapor deposition (PECVD) method, the plasma enhanced chemical vapor deposition (PECVD) method also employs: (1) a reactor chamber pressure of from about 2 to about 5 torr; (2) a source radio frequency power of from about 180 to about 220 watts; (3) a substrate 10 temperature of from about 380 to about 420 degrees centigrade; (4) a silane flow rate of from about 140 to about 180 standard cubic centimeters per minute (sccm); and (5) a nitrous oxide flow rate of from about 1200 to about 1600 standard cubic centimeters per minute (sccm).

When forming the barrier layer from such a silicon rich undoped silicate glass (USG) barrier material formed over an eight inch diameter substrate 10 while employing the high density plasma chemical vapor deposition (HDP-CVD) method, the high density plasma chemical vapor deposition (HDP-CVD) method also employs: (1) a reactor chamber pressure of from about 2 to about 5 mtorr; (2) a source radio frequency of from about 2500 to about 3500 watts at a source radio frequency of 13.56 MHZ; (3) a bias power of from about 2500 to about 3500 watts; (4) a substrate 10 temperature of from about 380 to about 420 degrees centigrade; (5) a silane flow rate of from about 130 to about 170 standard cubic centimeters per minute (sccm); (6) an oxygen flow rate of about 150 to about 250 standard cubic centimeters per minute (sccm); and (7) an argon flow rate of from about 100 to about 150 standard cubic centimeters per minute (sccm).

Within the preferred embodiment of the present invention, the first fluorosilicate glass (FSG) layer 14 is typically and preferably formed to a thickness H2 of from about 4000 to about 6000 angstroms, while the barrier layer 16 is typically and preferably formed to a thickness of from about 500 to about 1500 angstroms and the second fluorosilicate glass (FSG) layer 18 is typically and preferably formed to a thickness of from about 8000 to about 12000 angstroms. Each of the first fluorosilicate glass (FSG) layer 14, the barrier layer 16 and the second fluorosilicate glass (FSG) layer 18 is preferably formed in-situ within either a single reactor chamber or within adjoining reactor chambers within a single multi-chamber high density plasma chemical vapor deposition (HDP-CVD) reactor tool. As is illustrated within the schematic cross-sectional diagram of FIG. 1, the thickness H2 of the first fluorosilicate glass (FSG) layer 14 is typically and preferably greater than the thickness H1 of the pair of patterned layers 12a and 12b, and thus all portions of the upper surface of the first fluorosilicate glass (FSG) layer 14 are typically and preferably above the upper surfaces of the patterned layers 12a and 12b. Under such circumstances, there is provided within the context of the preferred embodiment of the present invention a maximum amount of fluorosilicate glass (FSG) dielectric material interposed between the pair of patterned layers 12a and 12b.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the second fluorosilicate glass (FSG) layer 18 has been planarized to form a planarized second fluorosilicate glass (FSG) layer 18', thus simultaneously also forming from the composite dielectric layer construction 19 as illustrated within the schematic cross-sectional diagram of FIG. 1 a planarized composite dielectric layer construction 19'.

Although various planarizing methods are known in the art of microelectronic fabrication which may be employed for forming from the second fluorosilicate glass (FSG) layer 18 the planarized second fluorosilicate glass (FSG) layer 18', including but not limited to reactive ion etch (RIE) etchback planarizing methods and chemical mechanical polish (CMP) planarizing methods, for the preferred embodiment of the present invention, the second fluorosilicate glass (FSG) layer 18 is preferably planarized to form the planarized second fluorosilicate glass (FSG) dielectric layer 18' while employing a chemical mechanical polish (CMP) planarizing method employing a silica chemical mechanical polish (CMP) slurry composition.

When chemical mechanical polish (CMP) planarizing the second fluorosilicate glass (FSG) layer 18 to form the planarized second fluorosilicate glass (FSG) layer 18' upon an eight inch diameter substrate 10, the chemical mechanical polish (CMP) planarizing method also employs: (1) a platen pressure of from about 5 to about 7 pounds per square inch (psi); (2) a platen rotation speed of from about 40 to about 60 revolutions per minute (rpm); (3) a head counter-rotation speed of from about 40 to about 60 revolutions per minute (rpm); (4) a substrate 10 temperature of from about 35 to about 45 degrees centigrade; and (5) an aqueous silica slurry composition of from about 10 to about 15 weight percent.

Notable within the method of the present invention, as is illustrated within the schematic cross-sectional diagram of FIG. 2, is the limitation that when planarizing the second fluorosilicate glass (FSG) layer 18 to form the planarized second fluorosilicate glass (FSG) layer 18' there is not penetrated the barrier layer 16. Within the present invention by not penetrating the barrier layer 16 there is maintained a complete encapsulation of the first fluorosilicate glass (FSG) layer 14 such that there is inhibited: (1) diffusion of moisture into the first fluorosilicate glass (FSG) dielectric layer 14 when chemical mechanical polish (CMP) planarizing the second fluorosilicate glass (FSG) layer 18; and (2) diffusion of fluorine dopant from the first fluorosilicate glass (FSG) layer 14 when chemical mechanical polish (CMP) planarizing the second fluorosilicate glass (FSG) layer 18. Such inhibited permeation of moisture into the first fluorosilicate glass (FSG) layer 14 also ensures within the first fluorosilicate glass (FSG) layer 14 incident to chemical mechanical polish (CMP) planarizing the second fluorosilicate glass (FSG) layer absence of formation of corrosive species, such as corrosive hydrofluoric acid species formed incident to reaction of moisture with mobile fluorine dopants within the first fluorosilicate glass (FSG) layer 14.

Under such circumstances it is plausible and under certain circumstances preferred within the preferred embodiment of the present invention, as is illustrated within the schematic cross-sectional diagram of FIG. 2, to avoid use of a liner layer formed encapsulating the pair of patterned layers 12a and 12b prior to forming the first fluorosilicate glass (FSG) layer 14 thereupon. The absence of such a liner layer, which would conventionally be formed employing a method and material analogous or equivalent to the method and material employed for forming the barrier layer 16, provides within the preferred embodiment of the present invention solely a desirably low dielectric constant fluorosilicate glass (FSG) dielectric material interposed between the patterned layers 12a and 12b, without the presence of any higher dielectric constant dielectric material from which would most likely be fabricated such a liner layer.

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the microelectronic fabrication has been exposed to a thermal exposure to form from the planarized second fluorosilicate glass (FSG) layer 18' a thermally annealed planarized second fluorosilicate glass (FSG) layer 18" and thus similarly also form from planarized composite dielectric layer construction 19' a thermally annealed planarized composite dielectric layer construction 19". Within the preferred embodiment of the present invention, the thermal exposure 20 is selected of magnitude and duration such that residual moisture and volatile mobile acidic species formed within the planarized second fluorosilicate glass (FSG) layer 18' incident to chemical mechanical polish (CMP) planarizing the second fluorosilicate glass (FSG) layer 18 or incident to adventitious ambient moisture absorption into the planarized second fluorosilicate glass (FSG) layer 18' (when planarized employing other than a chemical mechanical polish (CMP) planarizing method) is preferably fully outgassed. While thermal exposure conditions needed to effect that result are likely to vary incident to a thickness remaining for the planarized second fluorosilicate glass (FSG) layer 18', typically and preferably the thermal exposure will employ a conventional thermal exposure of from about 360 to about 420 degrees centigrade for a time period of from about 30 to about 60 minutes for a planarized second fluorosilicate glass (FSG) layer planarized to a thickness of from about 2000 to about 3000 angstroms, although other thermal exposure methods, such as but not limited to rapid thermal annealing (RTA) methods (having a thermal gradient of greater than about 150 degrees centigrade per second) may also be employed within the method of the present invention.

As is understood by a person skilled in the art, the microelectronic fabrication whose schematic cross-sectional diagram is illustrated in FIG. 3 may be further fabricated by forming thereupon additional patterned layers analogous or equivalent to the patterned layers 12a and 12b in turn having formed thereupon an additional thermally annealed planarized dielectric layer construction analogous or equivalent to the thermally annealed planarized dielectric layer construction 19" comprising the first fluorosilicate glass (FSG) layer 14, the barrier layer 16 and the thermally annealed planarized second fluorosilicate glass (FSG) layer 18". Under such circumstances, it may be desirable to first form upon the thermally annealed planarized second fluorosilicate glass (FSG) layer 18" a second barrier layer while employing methods and materials analogous or equivalent to the methods and materials employed for forming the barrier layer 16. Under such circumstances, the second barrier layer would typically and preferably have a thickness of from about 500 to about 1500 angstroms, analogously or equivalently with the barrier layer 16. As is understood by a person skilled in the art, the presence of two such barrier layers would provide within the microelectronic fabrication whose schematic cross-sectional diagram is illustrated in FIG. 3 optimal encapsulation of both the thermally annealed planarized second fluorosilicate (FSG) layer 18" and the first fluorosilicate glass (FSG) layer 14, while still providing an optimally planar thermally annealed planarized dielectric layer construction 19" having incorporated therein a minimum aggregate thickness of the barrier layer 16 and the second barrier layer, thus providing a maximum vertical dimension of fluorosilicate glass (FSG) dielectric material.

Upon forming the microelectronic fabrication whose schematic cross-sectional diagram is illustrated in FIG. 3, there is formed a microelectronic fabrication having formed therein a fluorosilicate glass (FSG) layer with enhanced stability. The present invention realizes the foregoing object by employing when forming the fluorosilicate glass (FSG) layer a bilayer fluorosilicate glass (FSG) layer having a barrier layer formed interposed between a first (lower) fluorosilicate glass (FSG) layer and a second (upper) fluorosilicate glass (FSG) layer within the bilayer fluorosilicate glass (FSG) layer, where the barrier layer is not penetrated when planarizing the second (upper) fluorosilicate glass (FSG) layer within the bilayer fluorosilicate glass (FSG) layer.

As is understood by a person skilled in the art, the preferred embodiment of the present invention is illustrative of the present invention rather than limiting of the present invention. Revisions and modifications may be made to methods, materials, structures and dimensions employed for forming a microelectronic fabrication in accord with the preferred embodiment of the present invention while still providing a microelectronic fabrication formed in accord with the present invention, as defined by the appended claims.

What is claimed is:

1. A method for forming a halogen doped glass layer comprising:

providing a substrate;

forming at least one contact layer over said substrate;

forming over the substrate and the contact layer, a first halogen doped glass layer;

forming upon the first halogen doped glass layer, a barrier layer; the barrier layer selected from the group comprising $SiO_2$, SiN, SiON, and Si rich undoped silicate glass (USG);

forming upon the barrier layer, a second halogen doped glass layer; and planarizing the second halogen doped glass layer, while not penetrating the barrier layer, to form from the second halogen doped glass layer, a planarized second halogen doped glass layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein:

the first halogen doped glass layer and the second halogen doped glass layer are each formed employing a first high density plasma chemical vapor deposition (HDP-CVD) method; and the barrier layer is formed in-situ with the first halogen doped glass layer and the second halogen doped glass layer, the barrier layer being formed of a silicon rich undoped silicate glass (USG) material formed employing a method selected from the group consisting of a second high density plasma chemical vapor deposition (HDP-CVD) method and a plasma enhanced chemical vapor deposition (PECVD) method.

4. The method of claim 1 wherein the second halogen doped glass layer is planarized to form the planarized second halogen doped glass layer employing a method selected from the group consisting of chemical mechanical polish (CMP) planarizing methods and reactive ion etch (RIE) etchback planarizing methods.

5. The method of claim 1 further comprising thermally annealing the planarized second halogen doped glass layer to form a thermally annealed planarized second halogen doped glass layer.

6. The method of claim 5 further comprising forming upon the thermally annealed planarized second halogen doped glass layer a second barrier layer.

7. The method of claim 1, wherein said first halogen doped glass layer has a thickness from about 4000 to 6000 Å, said barrier layer has a thickness from about 500 to 1500 Å, and said second halogen doped glass layer has a thickness from about 8000 to 12,000 Å.

8. The method of claim 1, wherein said barrier layer is comprised of Si rich undoped silicate glass (USG) having a silicon:oxygen atomic ratio of from about 1.1:2 to 1.3:2.

9. A method for forming a fluorosilicate glass (FSG) layer comprising:

providing a substrate;

forming at least one contact layer over said substrate;

forming over the substrate and the contact layer a first fluorosilicate glass (FSG) layer;

forming upon the first fluorosilicate glass (FSG) layer, a barrier layer; the barrier layer selected from the group comprising $SiO_2$, SiON, and Si rich undoped silicate glass (USG);

forming upon the barrier layer, a second fluorosilicate glass (FSG) layer; and planarizing the second fluorosilicate glass (FSG) layer, while not penetrating the barrier layer, to form from the second fluorosilicate glass (FSG) layer, a planarized second fluorosilicate glass (FSG) layer.

10. The method of claim 9 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

11. The method of claim 9 wherein:

the first fluorosilicate glass (FSG) layer and the second fluorosilicate glass (FSG) layer are each formed employing a first high density plasma chemical vapor deposition (HDP-CVD) method; and the barrier layer is formed in-situ with the first fluorosilicate glass (FSG) glass layer and the second fluorosilicate glass (FSG) layer, the barrier layer being formed of a silicon rich undoped silicate glass (USG) material formed employing a method selected from the group consisting of a second high density plasma chemical vapor deposition (HDP-CVD) method and a plasma enhanced chemical vapor deposition (PECVD) method.

12. The method of claim 9 wherein the second fluorosilicate glass (FSG) layer is planarized to form the planarized second fluorosilicate glass (FSG) layer employing a method selected from the group consisting of chemical mechanical polish (CMP) planarizing methods and reactive ion etch (RIE) etchback planarizing methods.

13. The method of claim 9 further comprising thermally annealing the planarized second fluorosilicate glass (FSG) layer to form a thermally annealed planarized second fluorosilicate glass (FSG) layer.

14. The method of claim 13 further comprising forming upon the thermally annealed planarized second fluorosilicate glass (FSG) layer a second barrier layer.

15. The method of claim 7, wherein said first fluorosilicate glass (FSG) layer has a thickness from about 4000 to 6000 Å, said barrier layer has a thickness from about 500 to 1500 Å, and said second fluorosilicate glass (FSG) layer has a thickness from about 8000 to 12,000 Å.

16. The method of claim 7, wherein said barrier layer is comprised of Si rich undoped silicate glass (USG) having a silicon:oxygen atomic ratio of from about 1.1:2 to 1.3:2.

17. A method for forming a fluorosilicate glass (FSG) layer comprising:

providing a substrate;

forming at least one contact layer over said substrate;

forming over the substrate and the contact layer a first fluorosilicate glass (FSG) layer; said first fluorosilicate glass (FSG) layer having a thickness from about 4000 to 6000 Å;

forming upon the first fluorosilicate glass (FSG) layer, a Si rich undoped silicate glass (USG) barrier layer; said Si rich undoped silicate glass (USG) barrier layer having a thickness from about 500 to 1500 Å;

forming upon the Si rich undoped silicate glass (USG) barrier layer, a second fluorosilicate glass (FSG) layer; said second fluorosilicate glass (FSG) layer having a thickness from about 8000 to 12,000 Å and planarizing the second fluorosilicate glass (FSG) layer, while not penetrating the Si rich undoped silicate glass (USG) barrier layer, to form from the second fluorosilicate glass (FSG) layer, a planarized second fluorosilicate glass (FSG) layer.

18. The method of claim 17, wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

19. The method of claim 17, wherein:
the first fluorosilicate glass (FSG) layer and the second fluorosilicate glass (FSG) layer are each formed employing a first high density plasma chemical vapor deposition (HDP-CVD) method; and
the Si rich undoped silicate glass (USG) barrier layer is formed in-situ with the first fluorosilicate glass (FSG) glass layer and the second fluorosilicate glass (FSG) layer of an undoped silicate glass (USG) material formed employing a method selected from the group consisting of a second high density plasma chemical vapor deposition (HDP-CVD) method and a plasma enhanced chemical vapor deposition (PECVD) method.

20. The method of claim 17, wherein the second fluorosilicate glass (FSG) layer is planarized to form the planarized second fluorosilicate glass (FSG) layer employing a method selected from the group consisting of chemical mechanical polish (CMP) planarizing methods and reactive ion etch (RIE) etchback planarizing methods.

21. The method of claim 17, wherein the contact layer is a patterned layer selected from the group consisting of patterned conductor layers, patterned semiconductor layers and patterned dielectric layers.

22. The method of claim 17, further comprising thermally annealing the planarized second fluorosilicate glass (FSG) layer to form a thermally annealed planarized second fluorosilicate glass (FSG) layer.

23. The method of claim 22, further comprising forming upon the thermally annealed planarized second fluorosilicate glass (FSG) layer a second barrier layer.

24. The method of claim 17, wherein said Si rich undoped silicate glass (USG) barrier layer has a silicon:oxygen atomic ratio of from about 1.1:2 to 1.3:2.

* * * * *